(12) United States Patent
Chang et al.

(10) Patent No.: US 7,374,811 B2
(45) Date of Patent: May 20, 2008

(54) PROBE PAD STRUCTURE IN A CERAMIC SPACE TRANSFORMER

(75) Inventors: Chi Shih Chang, Austin, TX (US); Bahadir Tunaboylu, Chandler, AZ (US)

(73) Assignee: SV Probe Pte Ltd., Singapore (SG)

( * ) Notice: Subject to any disclaimer, the term of this patent is extended or adjusted under 35 U.S.C. 154(b) by 1 day.

(21) Appl. No.: 11/399,711

(22) Filed: Apr. 5, 2006

(65) Prior Publication Data

US 2006/0257631 A1    Nov. 16, 2006

Related U.S. Application Data

(60) Provisional application No. 60/668,351, filed on Apr. 5, 2005.

(51) Int. Cl.
*B32B 3/00* (2006.01)
*H01K 1/03* (2006.01)
*H05K 1/11* (2006.01)

(52) U.S. Cl. ............... 428/209; 174/255; 174/262; 174/264; 361/803

(58) Field of Classification Search ........ 428/209–210; 174/250, 255, 262, 264; 361/803
See application file for complete search history.

(56) References Cited

U.S. PATENT DOCUMENTS 2,728,693 A * 12/1955 Cado ................ 216/12
3,791,858 A    2/1974 McPherson et al.
4,594,473 A * 6/1986 Inoue et al. .......... 174/257
4,942,076 A * 7/1990 Panicker et al. ....... 428/137
5,111,003 A * 5/1992 Kimbara ............... 174/255

(Continued)

FOREIGN PATENT DOCUMENTS

EP    0595752 A    5/1994

(Continued)

OTHER PUBLICATIONS

International Searching Authority, "Notification of Transmittal of the International Search report and the Written Opinion of the International Searching Authority, or the Declaration," PCT/US2006/012924, dated May 4, 2006, 11 pages.

(Continued)

*Primary Examiner*—Cathy F. Lam
(74) *Attorney, Agent, or Firm*—Hickman Palermo Truong & Becker LLP; Edward A. Becker

(57) ABSTRACT

A method for manufacturing a ceramic device is provided. The ceramic device comprises a ceramic layer. A polyimide layer is on the ceramic layer. The polyimide layer has disposed therein a plurality of copper vias. Each copper via is in physical contact with the ceramic layer. A plurality of pads are formed on the polyimide layer. Each of the plurality of pads is in physical contact with a copper via of the plurality of copper vias. In this way, the pads are supported by a continuous copper arrangement, thereby providing greater support for the probe pads than if the probe pads were supported by the polyimide layer, as the mechanical strength of polyimide layer is lower than the mechanical strength of copper.

11 Claims, 4 Drawing Sheets

Step 42

Step 43

U.S. PATENT DOCUMENTS

| | | | |
|---|---|---|---|
| 6,080,668 A * | 6/2000 | Lauffer et al. | 438/666 |
| 6,130,476 A * | 10/2000 | LaFontaine et al. | 257/678 |
| 6,300,576 B1 * | 10/2001 | Nakamura et al. | 174/261 |
| 6,664,485 B2 * | 12/2003 | Bhatt et al. | 174/264 |
| 6,815,126 B2 * | 11/2004 | Fey et al. | 430/9 |
| 7,240,429 B2 * | 7/2007 | Shiraishi et al. | 29/852 |
| 2001/0007289 A1 | 7/2001 | Bhatt et al. | |

FOREIGN PATENT DOCUMENTS

| | | |
|---|---|---|
| JP | 09-64227 A | 7/1997 |

OTHER PUBLICATIONS

Current Claims, PCT/US2006/012924, 3 pages.

The International Bureau of WIPO, "Notification Concerning Transmittal of International Preliminary Report on Patentability (Chapter 1 of the Patent Cooperation Treaty)", International application No. PCT/US2006/012924, dated Oct. 18, 2007, 7 pages.

Claims, International application No. PCT/US2006/012924, 2 pages.

* cited by examiner

Steps 1 and 2

Step 3

Step 4

Step 5

Step 6

Step 7

Step 8

Steps 9 and 10

Step 11

Step 12

Step 13

Step 14

Step 15

Step 16

Step 17

Step 18

Step 19

Step 42

Step 43

PROBE PAD STRUCTURE IN A CERAMIC SPACE TRANSFORMER

RELATED APPLICATION AND CLAIM OF PRIORITY

This application claims domestic priority under 35 U.S.C. §119(e) from prior U.S. provisional application Ser. No. 60/668,351, filed Apr. 5, 2005, entitled "PROBE PAD STRUCTURE IN A MULTILAYER CERAMIC SPACE TRANSFORMER," the contents of which is hereby incorporated herein by reference in its entirety for all purposes as if fully set forth herein.

FIELD OF THE INVENTION

The present invention generally relates to a probe pad structure in a ceramic device.

BACKGROUND

In recent years, there has been a tremendous push to miniaturize all electrical components, including integrated circuits and other computer chip products. The reduction in the size of ICs has placed a demand on test systems to determine new ways to achieve the tighter spacing needed to test the contact pads of the ICs.

Current processes utilize lithography to produce pad structures of copper and polyimide that have a tight-pitch of 150 µm or less. In these conventional processes, the resulting pads are pliable due to the fact that the pads are routed by copper/polyimide with a flexible polyimide located below the pad. As a result, wire bonding cannot be performed on these pads in a consistent manner.

Recently, a process called Chemical Mechanical Polishing (CMP) was developed to remove material from uneven topography on a wafer surface until a flat (planarized) surface is created. This allows subsequent photolithography to take place with greater accuracy, and enables film layers to be built up with minimal variations in height. CMP combines the chemical removal using a base fluid solution with a mechanical effect provided by abrasive polishing. CMP has particular applicability in the fabrication of copper-based semiconductors, where it is used to define the copper wiring structures.

BRIEF DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of the embodiments of the invention presented herein. It will be apparent, however, that the embodiments of the invention presented herein may be practiced without these specific details. In other instances, well-known structures and devices are shown in block diagram form in order to avoid unnecessarily obscuring the embodiments of the invention presented herein.

Embodiments of the invention relate to a novel manufacturing process for forming probe pads on copper pedestals. Embodiments of the invention have particular application in tight-pitch area arrays ceramics, such as a multilayer ceramic in a space transformer.

Figure 1:
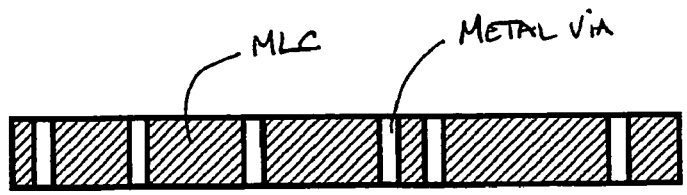
FIG. 1 graphically depicts the performance of steps 1-8 according to an embodiment of the invention.
Figure 1:
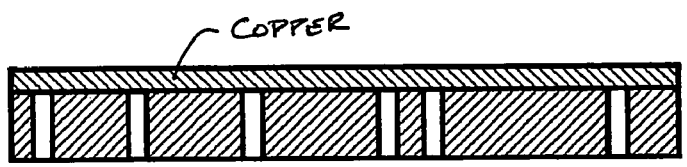
Figure 1:
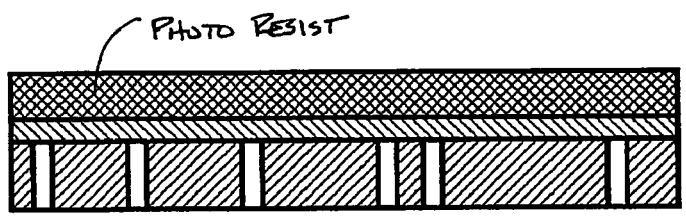
Figure 1:
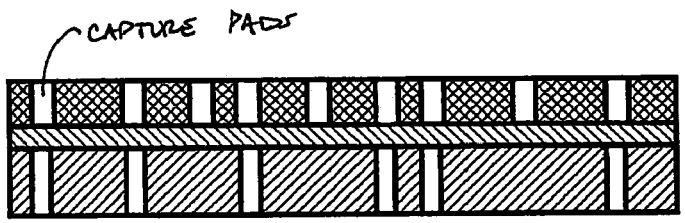
Figure 1:
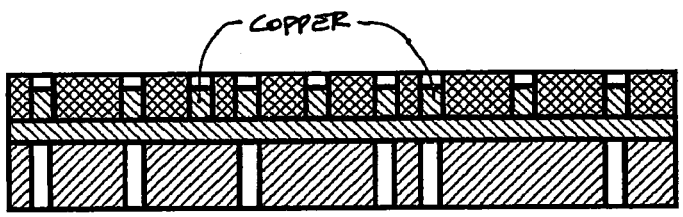
Figure 1:
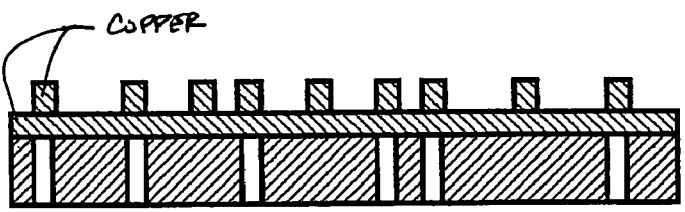
Figure 1:
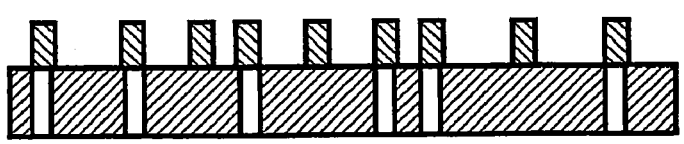
Figure 2:
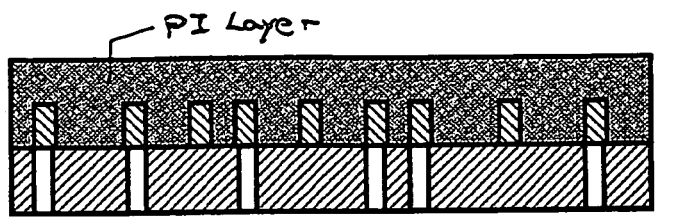
FIG. 2 graphically depicts the performance of steps 9-15 according to an embodiment of the invention.
Figure 2:
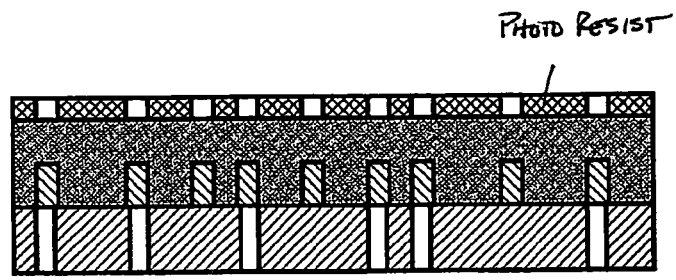
Figure 2:
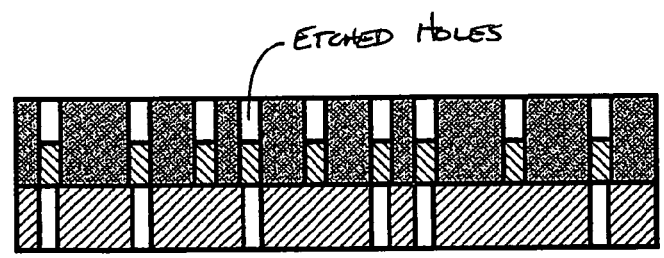
Figure 2:
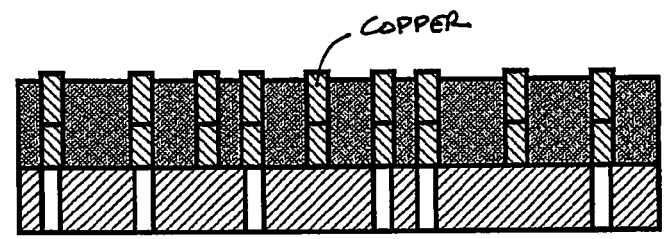
Figure 2:
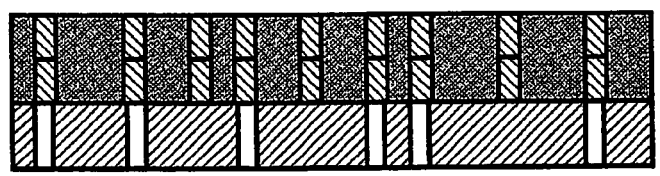
Figure 2:
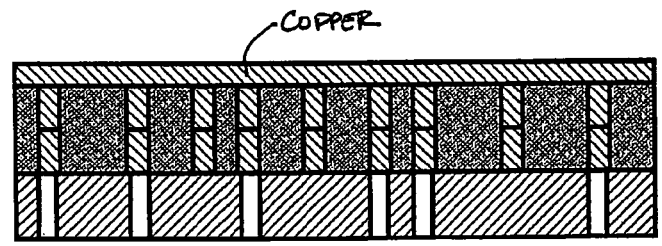
Figure 3:
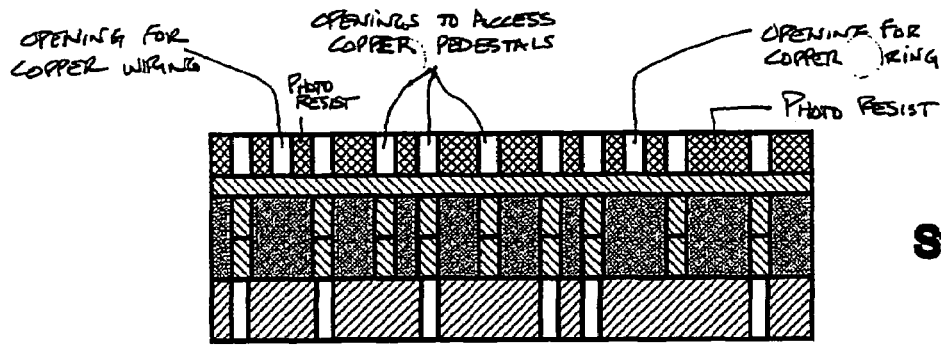
FIG. 3 graphically depicts the performance of steps 16-19 according to an embodiment of the invention.
Figure 3:
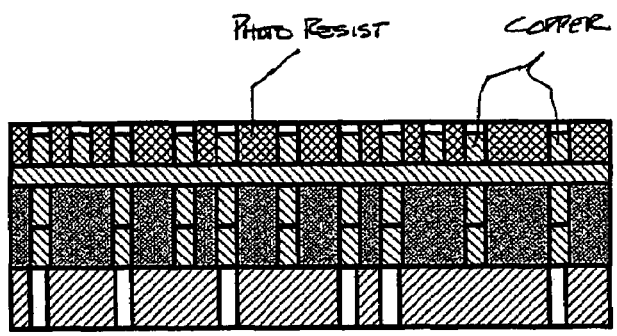
Figure 3:
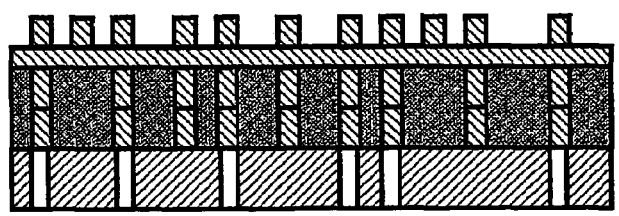
Figure 3:
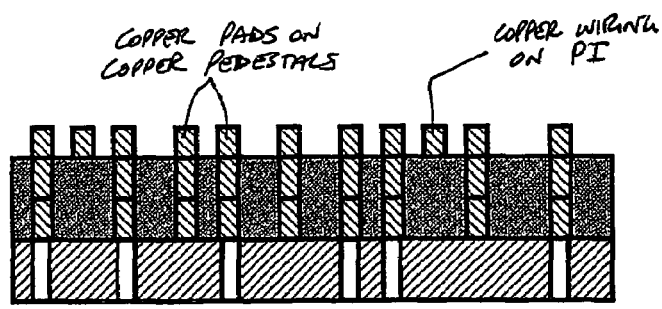
Figure 4:
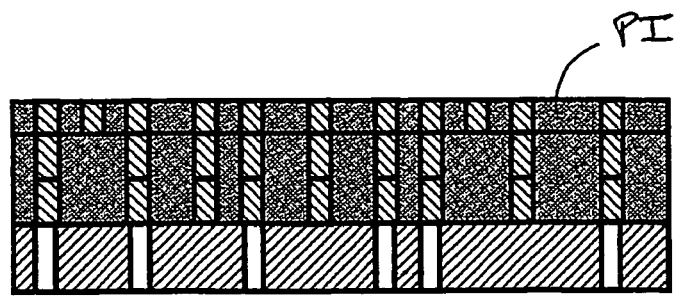
FIG. 4 graphically depicts the performance of steps 42-43 according to an embodiment of the invention.
Figure 4:
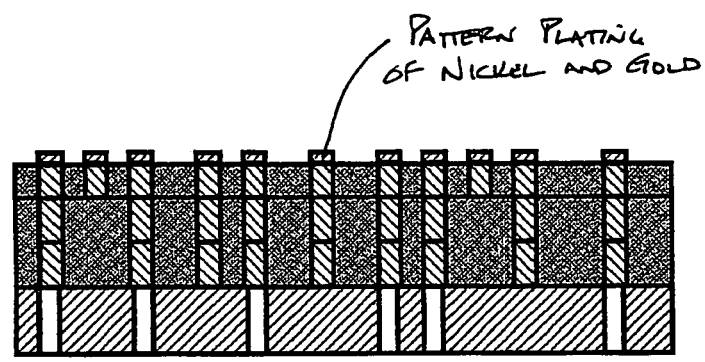

An embodiment of the invention is best understood through the following description of process steps that produce a space transformer with improved copper surface planarity. FIGS. 1-4 graphically depict the performance of the following process steps. The process is described as it relates to the formation of three copper layers on a polyimide (PI). The formation of three copper layers is described for purposes of providing a clear example, but any number of copper layers may be used in forming a copper pedestal. As a result, it should be noted that steps 20-41 in the below process correspond to a repetition of steps 9-19 in the illustrations.

PROCESS STEPS TO CONSTRUCTIVE A CERAMIC DEVICE ACCORDING TO AN EMBODIMENT

Step 1. Start with a finished multilayer ceramic (MLC) that has multiple metal vias on the surface. In an embodiment, the via pitch is about 200 µm or larger.

Step 2. Grind the MLC surface to reach a reasonable flatness. In an embodiment, the linear flatness is about 3 µm per linear inch. The surface texture should be such that good adhesion to plated copper can be assured.

Step 3. Deposit a layer of copper over substantially the entire MLC surface. In an embodiment, the layer of copper is a thin layer, e.g., about 1 to 3 µm in thickness.

Step 4. Coat substantially the whole surface with a thick photo resist layer. Any conventional photo resist material can be used. In an embodiment, the photo resist layer may be about 25 or 30 µm in thickness.

Step 5. Define the capture pads openings in the photo resist layer. The capture pad openings are defined by exposing and developing openings in the photo resist layer, thereby forming copper pedestal pads. Underneath some of the copper pedestal pads will be the ends of MLC via metal traces. Underneath the remaining copper pedestal pads, there will be no metal traces of the MLC. Instead, these copper pedestals are sitting directly on the rigid MLC surface. The copper layer that was deposited in step 3 will now be exposed. In an embodiment, the copper layer is not etched.

Step 6. Pattern plate a layer of cooper. In an embodiment, the layer of copper is a thick layer, e.g., about 20 µm thick. Pattern plating involves the electrolytic plating of a thick layer of copper on the portions of the copper layer that were exposed in step 5. In an embodiment, the plating thickness is less than the photo resist thickness. In an embodiment, the copper thickness may be as uniform as possible across the wafer.

Step 7. Remove the photo resist layer, thereby exposing the entire copper surface. At this stage, the copper thickness over the copper pedestal pads may be about 21 to 23 µm. The thickness of the copper over the remaining area may be about 1 to 3 µm.

Step 8. Dip-etch a portion of the thickness of the original copper layer. In an embodiment, the portion of the thickness of the original copper layer dip-etched in step may be about 2 to 4 µm thick. In such an embodiment, this will result in the reduction of about 2 to 4 µm of the copper thickness over the pedestal pads. After performing step 8, the remaining area will have the copper completely removed, leaving the MLC surface visible. At this stage, the copper pedestals are electrically isolated, unless they are connected inside the MLC by internal wirings. The height uniformity of the pedestals across the MLC substrate is primarily determined by the plating uniformity at step 6.

Step 9. Apply a coating of polyimide (PI) to form a layer of PI on the MLC substrate. In an embodiment, the layer of PI is formed with a thickness of about 45 to 55 µm. If application of a single coat of PI is not possible or economical, the PI layer can be formed using more than one coating to obtain the desired thickness.

Step 10. Grind the PI layer to reach a desired degree of flatness. In an embodiment, the thickness of the PI layer over the copper pedestals may be about 20 µm.

Step 11. Apply a photo resist coating on top of the PI layer. Expose and develop openings in the photo resist layer for via holes to access the copper pedestal pads.

Step 12. Etch the via openings in the PI layer, then strip off the remaining photo resist.

Step 13. Pattern plate copper over the via holes. In an embodiment, the thickness of the copper layer slightly over-fills the via holes in the PI layer. For example, the thickness of the copper layer may be about 22 to 25 µm.

Step 14. Grind the surface, such as through a Chemical Mechanical Polishing (CMP) process, to remove excess copper in the via holes plus a small amount of PI so that the whole surface is flat. If the copper layer in Step 13 does not overfill the via holes, then Step 14 would involve removing some PI first, then removing a thin layer of PI and copper using a CMP process.

Step 15. Plate a layer of copper over the entire surface. In an embodiment, the layer of copper plated over the entire surface may be thin, e.g., about 1 to 2 µm.

Step 16. Apply photo resist to the entire surface. In an embodiment, the photo resist layer is about 25 to 30 µm thick. Next, define the metal patterns for accessing the vias as well as for the wirings over the PI layer, including any jump wire patterns.

Step 17. Pattern plate another layer of copper. In an embodiment, the layer of copper may be formed thinner than that of the photo resist, e.g., the layer of copper may be up to 20 µm thick. The resulting layer of copper will cover both the copper wiring and the copper vias.

Step 18. Strip off the photo resist layer using a conventional stripping process.

Step 19. Dip etch the thin copper layer to remove a layer of copper. After the etching step, the PI surface between copper wiring should be visible. For example, the layer of copper removed may be about 2 to 320 µm thick. At this stage, the surface planarity is primarily determined by the thickness control of Step 17.

If only one copper wiring layer is needed, the process can proceed to Step 42. Otherwise, then the following steps are part of the process that may be followed in order to form a second copper wiring layer for wirings.

Step 20. Apply a coating of PI. In an embodiment, the coating of PI added in step 20 may be about 45 to 55 µm thick. If application of a single coat is not possible or economical, the PI layer can be formed using more than one coating to obtain the desired thickness.

Step 21. Grind the surface of the PI layer to achieve the desired flatness. At this point, the thickness of the PI layer over the first copper wiring lines is about 20 µm.

Step 22. Apply photo resist to the entire layer and then define the via openings in the photo resist for accessing the vias.

Step 23. Etch the via openings in the PI layer, then strip off photo resist.

Step 24. Pattern plate another copper layer over the via openings. In an embodiment, the copper layer may have a thickness of about 22 to 25 µm. The copper layer should slightly over-fill the via holes in the PI.

Step 25. Grind the surface to remove excess copper in the via holes plus a small amount of PI so that the whole surface is flat.

Step 26. Apply a layer of copper over the entire surface. In an embodiment, the layer of copper is thin, e.g., about 1 to 2 µm in thickness.

Step 27. Apply photo resist to the entire surface. In an embodiment, the photo resist layer may have a thickness of about 25 to 30 µm. After the photo resist layer is applied, define the metal patterns for accessing the vias as well as for the wirings over the PI, including jump wires patterns.

Step 28. Pattern plate a layer of copper. In an embodiment, the copper layer may have a thickness of up to about 20 µm. This copper layer may have a thickness that is less than the thickness of the photo resist layer.

Step 29. Strip off the photo resist layer.

Step 30. Dip etch the copper layer (for example, about 1 to 2 µm in thickness). At this time, the PI surface between copper wiring should be visible. The surface planarity is primarily determined by the thickness control of Step 28.

If only two copper wiring layers are required, then the process can proceed to Step 42. If an additional copper wiring layer is needed, then the following steps may be followed.

Step 31. Apply a coating of PI. In an embodiment, the coating of PI may have a thickness of about 45 to 55 µm. If application of a single coat is not possible or economical, the PI layer can be formed using more than one coating to obtain the required thickness.

Step 32. Grind the surface of the PI layer to achieve the desired flatness. In an embodiment, the thickness of the PI layer over the second copper wiring lines at this point may be about 20 µm.

Step 33. Apply photo resist to the entire layer and then define the via openings in the photo resist for accessing the vias.

Step 34. Etch the via openings in the PI layer, then strip off photo resist.

Step 35. Pattern plate another copper layer. In an embodiment, the copper layer may have a thickness of about 22 to 25 µm. The copper layer should slightly over-fill the via holes in the PI.

Step 36. Grind the surface to remove excess copper in the via holes plus a small amount of PI so that the whole surface is flat.

Step 37. Apply a layer plating of copper over the entire surface. In an embodiment, the layer of copper applied may be thin, e.g., about 1 to 2 µm in thickness.

Step 38. Apply photo resist to the entire surface. In an embodiment, the photo resist layer may have a thickness of about 25 to 30 µm. After the photo resist layer is applied, define the metal patterns for accessing the vias as well as for the wirings over the PI, including jump wires patterns.

Step 39. Pattern plate a layer of copper. In an embodiment, the copper layer may have a thickness of up to about 20 µm thick. Thus, this copper layer may have a thickness that is less than the thickness of the photo resist layer.

Step 40. Strip off the photo resist layer using a conventional stripping process.

Step 41. Dip etch the copper layer (for example, about 1 to 2 μm in thickness). At this time, the PI surface between copper wiring should be visible. The surface planarity is primarily determined by the thickness control of Step 39.

The following are the finishing steps to promote the planrization of the probing pads.

Step 42. Apply a coating of PI to form a layer that is thicker than the copper wiring. Thereafter, grind the PI layer until the copper metal in the wirings and probing pads are clearly defined. Note that the probing pads and the surrounding PI are at the same height at the completion of this step.

Step 43. Pattern plate the probing pad. For example, the probing pads may be platted with nickel and gold.

Embodiments of the invention have been determined to provide significant advantages over prior approaches. For example, using embodiments of the invention, every MLC via will have a copper pedestal that is fully resting on the MLC surface. Taking into account the MLC shrinkage tolerance, the diameter of such a pedestal should be large enough to cover the MLC vias. Also, it is possible to place copper pedestals in locations where no MLC vias exist. Since there is no MLC via underneath in this case, the diameter of such a pedestal can be smaller, allowing it to be placed in a tight area.

The process, according to embodiments of the invention, result in a vertical arrangement of a copper pedestal, a metal via, and a pad in a stack. As such, it provides the pad with the support necessary for a probing or bonding operation. While the mechanical strength of PI is lower than that of copper, embodiments of the invention alleviate this issue by providing a continuous copper column in each stack, thereby providing greater support than that of the PI layer.

Embodiments of the invention also provide excellent surface planarity for every pad on the space transformer top surface. Good surface planarity is important for whole area array probing. Additionally, embodiments of the invention eliminate the photo resist grinding steps that are part of conventional manufacturing processes.

What is claimed is:

1. A ceramic device, comprising:
   a ceramic layer, wherein the ceramic layer has disposed therein a plurality of metal vias;
   a polyimide layer, on the ceramic layer, having disposed therein a plurality of copper vias; wherein a first cross-sectional area of a first copper via, of the plurality of copper vias, is greater than a second cross-sectional area of a second copper via, of the plurality of copper vias; wherein the first copper via is not in physical contact with the second copper via;
   the first cross-sectional area of the first copper via, of the plurality of copper vias, is greater than a third cross-sectional area of a particular metal via, of the plurality of metal vias;
   the first copper via is in physical contact with the particular metal via of the plurality of metal vias, and the second copper via is not in physical contact with any metal via of the plurality of metal vias;
   a plurality of pads formed on the polyimide layer, wherein each of the plurality of pads is in physical contact with one copper via of the plurality of copper vias.

2. The ceramic device of claim 1, wherein at least one of the plurality of pads is plated with nickel and gold.

3. The ceramic device of claim 1, wherein at least a particular copper via, of the plurality of copper vias, has a cross-sectional area that is greater than the cross-sectional area of a particular metal via, disposed within the ceramic layer, in physical contact with the particular copper via.

4. The ceramic device of claim 1, wherein the ceramic layer comprises a multilayer ceramic (MLC).

5. The ceramic device of claim 1, wherein a surface, which is (a) defined by the polyimide layer and the copper vias and (b) in contact with the plurality of pads, is substantially flat.

6. The ceramic device of claim 1, wherein:
   the polyimide layer comprises a first polyimide layer and a second polyimide layer;
   the first polyimide layer is on the ceramic layer;
   the second polyimide layer is on the first polyimide layer;
   the plurality of copper vias is a first plurality of copper vias;
   the first plurality of copper vias is disposed within the first polyimide layer and the second polyimide layer;
   a second plurality of copper vias is disposed within the second polyimide layer but not within the first polyimide layer;
   the second plurality of copper vias is not in physical contact with the ceramic layer; and
   each of the plurality of pads is in physical contact with either one copper via of the first plurality of copper vias or one copper via of the second plurality of copper vias.

7. The ceramic device of claim 1, wherein each pad of the plurality of pads is in a vertical arrangement with one copper via of the plurality of copper vias.

8. The ceramic device of claim 1, wherein each pad of the plurality of pads is on top of one copper via of the plurality of copper vias.

9. The ceramic device of claim 1, wherein:
   at least a portion of the plurality of copper vias are in physical contact with the plurality of metal vias; and
   each pad of the plurality of pads is in a vertical affangement with both one copper via of the portion of the plurality of copper vias and one metal via of the plurality of metal vias.

10. The ceramic device of claim 1, wherein:
    a particular copper via of the plurality of copper vias has a first end, a second end, and a cross-sectional area; and
    the cross-sectional area is substantially constant from the first end to the second end of the particular copper via.

11. The ceramic device of claim 1, wherein:
    the polyimide layer has a first surface and a second surface;
    the first surface is in physical contact with the ceramic layer;
    the second surface is in physical contact with the plurality of pads; and
    a particular copper via of the plurality of copper vias extends through the polyimide layer from the first surface to the second surface.

* * * * *

UNITED STATES PATENT AND TRADEMARK OFFICE
CERTIFICATE OF CORRECTION

PATENT NO. : 7,374,811 B2 Page 1 of 1
APPLICATION NO. : 11/399711
DATED : May 20, 2008
INVENTOR(S) : Chang et al.

It is certified that error appears in the above-identified patent and that said Letters Patent is hereby corrected as shown below:

Column 6, Claim 9, Line 41    "affangement" should read "arrangement"

Signed and Sealed this

Twenty-fourth Day of February, 2009

JOHN DOLL
*Acting Director of the United States Patent and Trademark Office*